Nov. 24, 1959 A. UHLIR, JR 2,914,715

SEMICONDUCTOR DIODE

Filed July 2, 1956

INVENTOR
A. UHLIR, JR.
BY
Arthur J. Torsiglieri
ATTORNEY

United States Patent Office 2,914,715

Patented Nov. 24, 1959

2,914,715

SEMICONDUCTOR DIODE

Arthur Uhlir, Jr., Summit, N.J., assignor to Bell Telephone Laboratories, Incorporated, New York, N.Y., a corporation of New York Application July 2, 1956, Serial No. 595,347

7 Claims. (Cl. 317—234)

Figure 1:
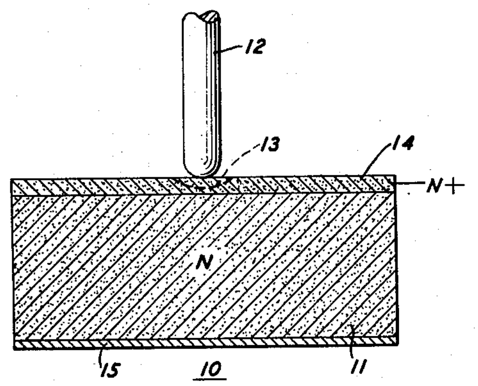

This invention relates to semiconductor diodes which include rectifying barriers.

The rectifying barrier in a semiconductor currently best understood is the p-n junction in the transition region between contiguous regions of p-type conductivity and n-type conductivity where the fixed charge density changes sign. In this instance, the fixed charge comprises ionized impurity atoms in the bulk of a semiconductor.

However, a fixed charge on a surface portion of a semiconductor body, if opposite in sign to the fixed charge in the bulk, will lead to rectifying barriers with the necessary qualitative aspects of bulk p-n junctions. Such a rectifying barrier results when an electrode of suitable material is positioned in contact with a surface portion of a semiconductor body. For example, a rectifying barrier is formed adjacent the interface when a copper-beryllium, gold or tungsten electrode is positioned in contact with the usual form of n-type germanium.

It is now a common theory that in the latter case the rectifying barrier results because the electrode induces a fixed charge of sign opposite that of the bulk in a surface portion at the electrode-semiconductor interface. Then this surface portion of the body may be viewed as of conductivity type opposite that of the bulk whereby there results a p-n junction which is similar to that resulting between contiguous bulk portions of opposite conductivity type.

Semiconductor diodes including a rectifying barrier are now well known for use in various applications, including rectification, modulation, detection and switching.

For many applications, where operation at high frequencies is important, it has been found desirable to restrict the area of the rectifying barrier to minmize its resistance-capacitance time constant. As a result, diodes for such applications generally comprise a semiconductive body which is separated by a rectifying barrier into a gross portion and a smaller portion and separate electrodes are connected to each of the different portions. The two portions are designed so that in operation the current comprises largely a flow from the smaller portion into the gross portion of carriers of the type normally in the minority in the gross portion.

I have found that an effect which is important in the use of such diodes at high frequencies or at fast switching speeds is that of minority carrier storage in the region of the gross portion of the body which is adjacent the rectifying barrier. Such storage is objectionable because at high frequency operation the minority carriers so stored tend to return across the rectifying barrier, thus producing a current that cancels the current that accompanied their original injection across the rectifying barrier. This action limits the usefulness of such a diode for the conversion of high frequency signals to lower frequencies or direct current. In particular this effect is undesirable in microwave diodes to be used in frequency conversion downwards. Moreover, minority carrier storage seriously reduces the speed with which a diode may be switched from a low impedance state to a high impedance state.

While never previously analyzed in this fashion, microwave diodes of the prior art have avoided the undesirable storage effect described by the use of very small point electrodes to limit the area of the injection source of the minority carriers. The use of such electrodes minimized the chances of return thereto of carriers previously injected across the rectifying barriers.

However, the use of very small point contact connections is undesirable from a standpoint of power handling capacity and ruggedness. It is characteristic of microwave diodes of the prior art that they have a poor resistance to burn-out.

Accordingly, an object of the present invention is to increase the ruggedness and power handling capacity of microwave diodes.

A related object is to minimize in a semiconductor diode including a rectifying barrier minority carrier storage whereby an enhanced frequency response, i.e., a shorter switching time, may be realized.

To these ends, the present invention provides a semiconductor diode which is characterized by a novel distribution of impurity atoms in the region of the semiconductor body adjacent the rectifying barrier where minority carriers ordinarily tend to be stored. In particular, the impurity distribution in this region is adjusted to provide a decrease in the fixed charge density with increasing distance into the bulk away from the rectifying barrier. A gradient in the fixed charge density of this kind gives rise to a built-in electric field in the normally space-charge neutral region adjacent the rectifying barrier, which superimposes a drift velocity component on the normal diffusion velocity component to flow away from the rectifying barrier and so militates against the storage of injected minority carriers in this region and reduces the return of injected carriers back to the injection source.

The benefits received from an impurity distribution of the kind described may be used advantageously either to provide an increased frequency response to the diode or to improve its power handling capacity by permitting use of an injection source which makes a larger area contact to the semiconductor.

Additionally, it is found that an impurity distribution of the kind described lowers the impedance of the rectifying barrier to forward currents, thereby increasing the current handling capacity of the diode.

The impurity distribution described is to be distinguished from impurity distributions used in prior art diodes to improve the impedance characteristics of the diode, which were characterized by the formation of a layer of lower fixed charge density in a region of the body adjacent the rectifying barrier. It can be appreciated that diodes in accordance with the present invention are characterized by an impurity distribution which is substantially antithetical to the impurity distribution of such prior art devices.

In a characteristic embodiment of the invention, a semiconductor body which includes a rectifying barrier is provided with a region adjacent the barrier in which the fixed charge density decreases with distance away from the barrier deeper into the bulk portion of the body, and separate electrode connections are provided to the body on opposite sides of the rectifying barrier.

In one illustrative embodiment, a germanium wafer whose bulk portion is weakly n-type is provided with a beryllium-copper electrode which gives rise to a retifying barrier in the wafer proximate to such electrode and the donor density in the region of the wafer proximate to such electrode is made to decrease with ditsance into the bulk away from such electrode.

In another illustrative embodiment, a germanium wafer whose bulk is n-type but which includes a small aluminum-rich p-type region for defining a p-n junction is provided in the n-type portion with a region adjacent the junction in which the donor density decreases with distance into the bulk away from the junction and separate electrodes are connected to the body on opposite sides of the junction.

Figure 2:
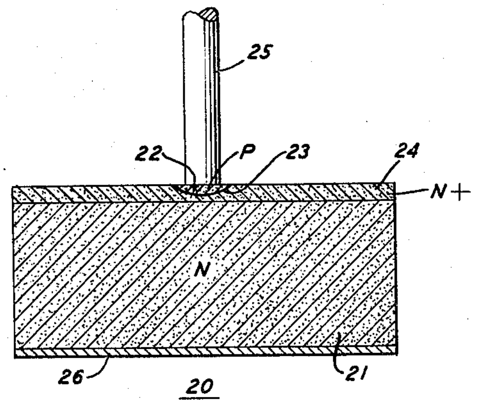

The invention will be discussed in greater detail in conjunction with the accompanying drawing in which:

Fig. 1 shows in cross-sectional view a semiconductor diode in accordance with the invention in which the rectifying barrier in the semiconductor body results from the effect of the presence of an electrode connection thereto; and Fig. 2 shows as an alternative embodiment a semiconductor diode in which the rectifying barrier in the semiconductor body results from a chemical charge p-n junction in the body.

In the interest of facility of illustration, the dimensions are not shown to scale.

In the illustrative embodiment shown in Fig. 1, the semiconductor diode comprises a semiconductor body whose bulk portion 11 is n-type, corresponding to a predominance of donor conductivity-type determining impurities. The diode further includes an electrode 12 which makes contact to a restricted portion of a surface of the body. However, such contact area may nevertheless be larger than is normally the case for point-contact microwave diodes. The electrode material is chosen so that a rectifying barrier, shown on an enlarged scale by the broken line 13 is formed in the body adjacent the contact area. As previously discussed, one theory is that there is induced a negative fixed charge in the region enclosed by the rectifying barrier, so that such region becomes p-type and the rectifying barrier is simply a p-n junction. At the region of the bulk portion adjacent the rectifying barrier, the wafer includes a more heavily doped n-type (designated $n+$) layer 14 whose specific resistivity increases with distance into the bulk away from the rectifying barrier. This corresponds to a region in which the donor preponderance decreases from a value larger than is characteristic of the main portion of the bulk to the value characteristic of the main portion of the bulk. Advantageously, the donor concentration in this layer decreases exponentially with distance away from the rectifying barrier into the bulk. It is this variation in fixed charge density in the layer 14 which provides a built-in electric field which accelerates the flow of holes injected from electrode 12 which diffuses across the rectifying barrier and so minimizes the storage of such holes in the region adjacent the rectifying barrier. The diode also includes an electrode 15 which makes a low-resistance connection to the bulk portion of the body.

A typical diode of this type was fabricated as follows: There was first prepared an n-type monocrystalline zone-leveled germanium wafer of 0.2 ohm-centimeter specific resistivity and having dimensions 50 mils by 50 mils by 20 mils with the 50 to 50 mil faces perpendicular to the <100> direction. The wafer was cut from a larger germanium ingot prepared in the manner described in United States Patent 2,739,088 which issued March 20, 1956 to W. G. Pfann. The wafer was etched to microscopic smoothness in a mixture of hydrofluoric and nitric acids in the manner known to workers in the art. The layer 14 was formed in the wafer by vapor-solid diffusion techniques of the kind described in the W. Shockley application Serial No. 496,201, filed March 23, 1955 now Patent No. 2,868,678 issued January 13, 1959. In particular, the wafer was sealed in an evacuated quartz tube along with an arsenic doping charge. The doping charge consisted of crushed germanium doped with arsenic to a specific resistivity of 0.002 ohm-centimeter and of approximately the same weight as the wafer. The sealed quartz tube was inserted in a furnace that had been preheated to 750° C. After about fifteen minutes, the power to the furnace was turned off and the quartz tube was allowed to remain in the furnace until the temperature dropped to 350° C. The cooling time was approximately forty minutes. The quartz tube was broken open and the wafer removed. This treatment formed over the surface of the germanium an arsenic-diffused region in which the arsenic concentration decreased with distance into the wafer.

The wafer was then plated on one large area face in a gold-plating bath containing antimony in the manner known to workers in the art. The wafer was thereafter heated to 470° C. and allowed to cool alloying the gold-antimony to the bulk germanium. It is immaterial whether or not the arsenic-diffused surface layer is penetrated completely. The alloyed face was then soldered to a stud with solder containing antimony to assure a low resistance connection. By this technique, there was provided the low resistance electrode connection 15 to the bulk portion of the body.

There was also provided on the larger area face opposite that which had been alloyed a beryllium-copper wire element of 5 mils diameter, whose point had been blunted by electrolytic etching. The element was positioned in spring contact with the surface in a manner to provide a contact area which was estimated to be about one mil in diameter. As is known to workers in the art, an electrode connection of this kind to an n-type germanium wafer will give rise to a rectifying barrier in the wafer proximate to the contact area. It is of course feasible to provide a bonded electrode instead.

In Fig. 2 there is shown as an alternative embodiment a semiconductor diode 20 which differs from that shown in Fig. 1 by the inclusion in the semiconductor wafer whose gross portion 21 is n-type a discrete heavily p-type zone 22 in which acceptor-type chemical impurities are preponderant. The region of the n-type portion contiguous with the p-type zone which forms therewith the p-n junction 23 is a layer 24 in which the predominance of donor-type chemical impurities varies from a relatively large value in the region proximate to the junction to a smaller value characteristic of most of the n-type portion of the wafer with increasing distance away from the junction into the gross portion. Separate electrodes 25 and 26 make low resistance ohmic connections to the n-type portion 21 and p-type zone 22, respectively.

A diode of this kind typically may be made by first preparing in the manner previously described an n-type germanium wafer which includes a surface layer which has been arsenic-diffused to provide an increase in specific resistivity with increasing distance into the wafer. Additionally, a low resistance electrode connection to one broad face of the wafer is made in the manner previously described. Thereafter, to form the discrete p-type zone, there is first evaporated a thin dot of aluminum on the face opposite that to which the first electrode connection has been made and the wafer is thereafter heated to alloy the aluminum into the wafer to form an aluminum-rich p-type zone. Precautions must be taken to avoid alloying completely through the arsenic-diffused surface layer. Complete penetration may be avoided by limiting the amount of aluminum deposited and the alloying temperature in the manner known to workers in the art. For example, in a paper by C. A. Lee entitled, "A High-Frequency Diffused Base Germanium Transistor," appearing in the January 1956 issue of the Bell System Technical Journal, pages 23 through 24, there is described a technique for alloying aluminum to form a p-type surface portion on a germanium wafer which previously had had formed thereover an n-type arsenic-diffused surface layer in the manner described hereinabove in a way to avoid complete penetration of the arsenic-diffused layer. Thereafter, a low resistance ohmic connection is made to the aluminum-rich p-type region in the manner known to workers in the art. Typically, such electrode connection may comprise a bonded gold wire.

In a diode of the type shown in Fig. 2, it is feasible by appropriate design to incorporate a rectifying barrier of large area without increasing the resistance-capacitance time constant of the barrier unduly. Accordingly, a diode of this type can more readily be adapted for high power operation with little effect on the upper frequency limit.

Diodes of the kind described are useful in various applications. For example, they may be used as replacements for the microwave diodes of the prior art in known detection systems and mixer circuits. As previously indicated, diodes of the kind described have special application in frequency conversion systems where the conversion is to be from a higher frequency to a lower frequency. Various systems in which the diodes described may advantageously be incorporated are described in G. C. Southworth's book entitled "Principles and Applications of Waveguide Transmission," pages 614 through 648, published by D. Van Nostrand Co., New York (1950).

Additionally, because diodes of the kind described are capable of increased switching speeds, they find useful application as switching elements in logic circuits of computers.

In diodes of this kind the characteristics of the intermediate layer, or drift region, are significant design parameters. In particular, to realize fully the benefits of the invention, it is desirable that the transit time across the drift region of the minority carriers injected be small compared to a period of the signal voltage. The parameters of the drift region are readily amentable to control in the fabrication process described by control of the vapor-solid diffusion step.

It should, of course, be obvious that the principles of the invention are not limited to the specific embodiments described in detail. In particular, the drift region and the rectifying barrier may be formed by any other suitable techniques and with any other suitable impurities.

Additionally, although each of the embodiments described specifically employs an n-type bulk portion, conversely there may be utilized a p-type bulk with the appropriate changes obvious to the worker in the art.

Moreover, the diode may be fabricated of other suitable semiconductor materials, such as silicon, silicon-germanium alloys, and group III—group V intermetallic compounds.

Additionally, in each of the embodiments disclosed, the region on one side of the rectifying barrier has had a much higher concentration of majority carriers than has had the region on the other side so that the forward current across the rectifying barrier comprises largely only a flow of the carriers of the type predominant in the region on the one side therefrom to the region on the other side. In such instances, it is adequate to inhibit minority carrier storage simply in the region on said other side of the rectifying barrier. It is feasible, however, to provide in a semiconductor diode by appropriate design that the forward current across the rectifying barrier comprise a significant flow of carriers of both signs in opposite directions across the rectifying barrier. In this instance, it would be advantageous to include a separate drift region of the kind described in the region adjacent each of the two sides of the rectifying barrier to inhibit minority carrier storage there.

What is claimed is:

1. A semiconductor diode including only one rectifying barrier and comprising a semiconductor body including a first zone of one conductivity type, a second zone of the opposite conductivity type including a layer contiguous with said first zone which is characterized by a specific resistivity which increases with distance away from said first zone deeper into said second zone, and a separate low resistance electrode connection to each of said first and second zones, said low resistance connection to the second region being made to the higher resistivity portion of said second region.

2. A semiconductor diode according to claim 1 further characterized in that the relative concentrations of carriers in the first and second zones are such that the forward current across the rectifying junction comprises primarily a flow of carriers from said first zone into said second zone.

3. A semiconductor diode including only one rectifying junction and comprising a semiconductor body which includes a gross portion of one conductivity type and a smaller portion of opposite conductivity type for defining said rectifying junction with the gross portion, characterized in that the gross portion includes a layer proximate the rectifying junction whose specific resistivity increases with distance away from the rectifying junction into the gross portion, and a separate low resistance electrode connection to each of the two portions of the body, said low resistance connection to said second portion being made to the higher resistivity region of said second portion.

4. A semiconductor diode according to claim 3 further characterized in that the relative concentrations of carriers in the gross portion and the smaller portion are such that the forward current across the rectifying junction comprises primarily a flow of carriers from said smaller portion into said gross portion.

5. A semiconductor diode including only one rectifying barrier and comprising a semiconductor body, an electrode connection to said body which introduces a rectifying barrier in said body adjacent the contact region, and a low resistance connection to the body, the body being characterized in that the specific resistivity of the region proximate the rectifying barrier increases with distance away from the rectifying barrier and towards said low resistance connection.

6. A semiconductor diode including only one rectifying barrier and comprising a semiconductor body which is divided by the said rectifying barrier into first and second portions, of which at least the second portion is characterized by a region proximate the rectifying barrier whose specific resistivity increases with increasing distance away from the rectifying barrier, and a separate low resistance connection to the body on each of the said first and second portions, said low resistance connection to said second portion being made to the higher resistivity region of said second portion.

7. A semiconductor diode including only one rectifying barrier and comprising a germanium wafer whose gross portion is n-type and which includes a p-type aluminum alloy portion forming said rectifying junction with the gross portion, and a separate low resistance connection to each of the n-type and p-type portions, further characterized in that the gross portion includes an arsenic-diffused region proximate the rectifying junction in which the arsenic concentration decreases with distance away from the rectifying junction, and toward said low resistance connection.

References Cited in the file of this patent

UNITED STATES PATENTS

| | | |
|---|---|---|
| 2,597,028 | Pfann | May 20, 1952 |
| 2,764,642 | Shockley | Sept. 25, 1956 |
| 2,767,358 | Early | Oct. 16, 1956 |
| 2,810,870 | Hunter et al. | Oct. 22, 1957 |
| 2,811,653 | Moore | Oct. 29, 1957 |

FOREIGN PATENTS

| | | |
|---|---|---|
| 1,098,372 | France | Mar. 2, 1955 |